(12) United States Patent
Goldberg et al.

(10) Patent No.: US 9,132,623 B2
(45) Date of Patent: Sep. 15, 2015

(54) METHOD OF MARKING A TRANSPARENT SUBSTRATE FOR VISUAL ALIGNMENT

(71) Applicants: Evan M. Goldberg, The Woodlands, TX (US); Christopher Derichs, Buda, TX (US)

(72) Inventors: Evan M. Goldberg, The Woodlands, TX (US); Christopher Derichs, Buda, TX (US)

(73) Assignee: UNIPIXEL DISPLAYS, INC., Santa Clara, CA (US)

( * ) Notice: Subject to any disclaimer, the term of this patent is extended or adjusted under 35 U.S.C. 154(b) by 49 days.

(21) Appl. No.: 13/851,933

(22) Filed: Mar. 27, 2013

(65) Prior Publication Data

US 2014/0290518 A1    Oct. 2, 2014

(51) Int. Cl.
*B41F 5/24*    (2006.01)
*B41F 33/00*    (2006.01)

(52) U.S. Cl.
CPC .............. *B41F 5/24* (2013.01); *B41F 33/0036* (2013.01)

(58) Field of Classification Search
CPC ............... B41F 5/04; B41F 5/06; B41F 5/24; B41F 17/14; B41F 13/12; B41F 13/14; B41F 13/16; B41F 33/00; B41F 33/0036
USPC ............ 101/481, 485, 486, DIG. 36
See application file for complete search history.

(56) References Cited

U.S. PATENT DOCUMENTS

| | | | |
|---|---|---|---|
| 4,704,033 A | 11/1987 | Fay et al. | |
| 5,822,119 A | 10/1998 | Rasmussen et al. | |
| 5,900,637 A | 5/1999 | Smith | |
| 5,909,235 A * | 6/1999 | Folkins | 347/240 |
| 6,082,412 A | 7/2000 | Wildeman et al. | |
| 6,285,033 B1 | 9/2001 | Matsumoto | |
| 6,343,550 B1 | 2/2002 | Feesler | |
| 7,138,919 B2 | 11/2006 | Clare et al. | |
| 8,146,497 B2 | 4/2012 | Caliari | |
| 8,384,691 B2 | 2/2013 | Frey et al. | |
| 2002/0170451 A1 | 11/2002 | Nakazawa et al. | |
| 2004/0017431 A1 | 1/2004 | Mizuyama et al. | |
| 2007/0068404 A1 | 3/2007 | Hirahara et al. | |
| 2008/0250961 A1* | 10/2008 | Sugiyama et al. | 101/481 |
| 2010/0122638 A1 | 5/2010 | Schneider et al. | |
| 2011/0045248 A1 | 2/2011 | Hoffmuller et al. | |

OTHER PUBLICATIONS

International Search Report of the International Searching Authority (Korea) for corresponding international application PCT/US2013/065903 dated Feb. 5, 2014.

(Continued)

*Primary Examiner* — Leslie J Evanisko
(74) *Attorney, Agent, or Firm* — Basil M. Angelo

(57) ABSTRACT

A multi-station flexographic printing system includes a first flexographic printing station that includes a first flexo master. The system includes one or more additional flexographic printing stations, wherein each of the one or more additional flexographic printing stations includes a flexo master. The first flexo master includes one or more alignment boxes in one or more unique positions. Each flexo master of the one or more additional flexographic printing stations includes an alignment box completion in a predetermined position. A method of marking a substrate for visual alignment includes printing one or more alignment boxes in one or more unique positions on a substrate. One or more alignment box completions are printed in one or more predetermined positions on the substrate. The one or more predetermined positions correspond to the one or more unique positions.

12 Claims, 12 Drawing Sheets

(56) References Cited

OTHER PUBLICATIONS

Written Opinion of the International Searching Authority (Korea) for corresponding international application PCT/US2013/065903 dated Feb. 5, 2014.

International Search Report of the International Searching Authority (Korea) for international application PCT/US2013/065898 dated Feb. 3, 2014.

Written Opinion of the International Searching Authority (Korea) for international application PCT/US2013/065898 dated Feb. 3, 2014.

* cited by examiner

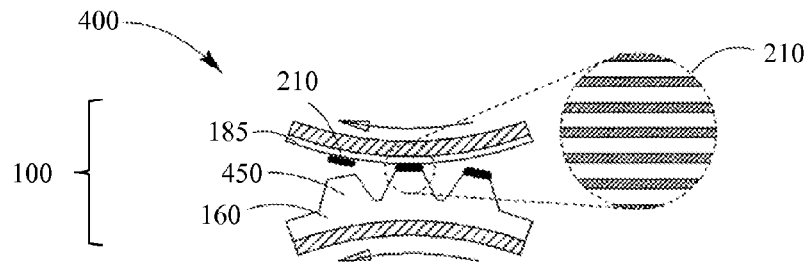
FIG. 4A
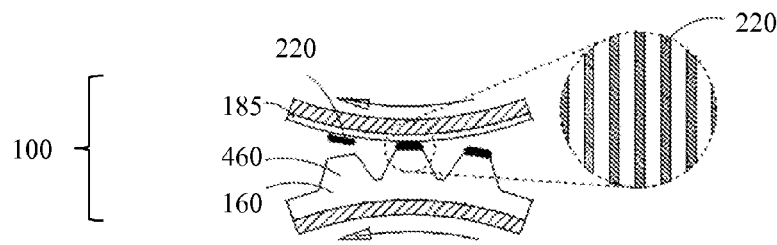
FIG. 4B
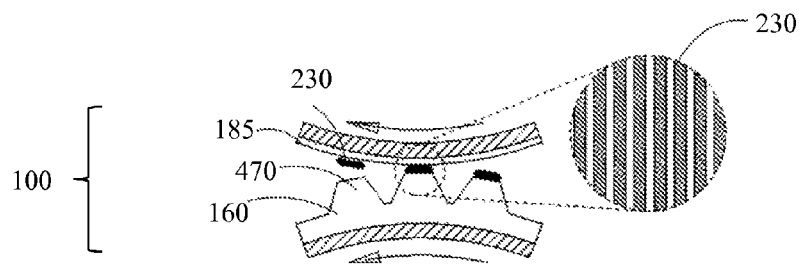
FIG. 4C
FIG. 4

METHOD OF MARKING A TRANSPARENT SUBSTRATE FOR VISUAL ALIGNMENT

BACKGROUND OF THE INVENTION

An electronic device with a touch screen allows a user to control the device by touch. The user may interact directly with the objects depicted on the display through touch or gestures. Touch screens are commonly found in consumer, commercial, and industrial devices including smartphones, tablets, laptop computers, desktop computers, monitors, gaming consoles, and televisions. A touch screen includes a touch sensor that includes a pattern of conductive lines disposed on a substrate.

Flexographic printing is a rotary relief printing process that transfers an image to a substrate. A flexographic printing process may be adapted for use in the fabrication of touch sensors. In addition, a flexographic printing process may be adapted for use in the fabrication of flexible and printed electronics ("FPE").

BRIEF SUMMARY OF THE INVENTION

According to one aspect of one or more embodiments of the present invention, a multi-station flexographic printing system includes a first flexographic printing station that includes a first flexo master. The system includes one or more additional flexographic printing stations, wherein each of the one or more additional flexographic printing stations includes a flexo master. The first flexo master includes one or more alignment boxes in one or more unique positions. Each flexo master of the one or more additional flexographic printing stations includes an alignment box completion in a predetermined position.

According to one aspect of one or more embodiments of the present invention, a method of marking a substrate for visual alignment includes printing one or more alignment boxes in one or more unique positions on a substrate. One or more alignment box completions are printed in one or more predetermined positions on the substrate. The one or more predetermined positions correspond to the one or more unique positions.

Other aspects of the present invention will be apparent from the following description and claims.

BRIEF DESCRIPTION OF THE DRAWINGS

FIG. 4 shows a portion of a multi-station flexographic printing system in accordance with one or more embodiments of the present invention.

DETAILED DESCRIPTION OF THE INVENTION

Figure 1:
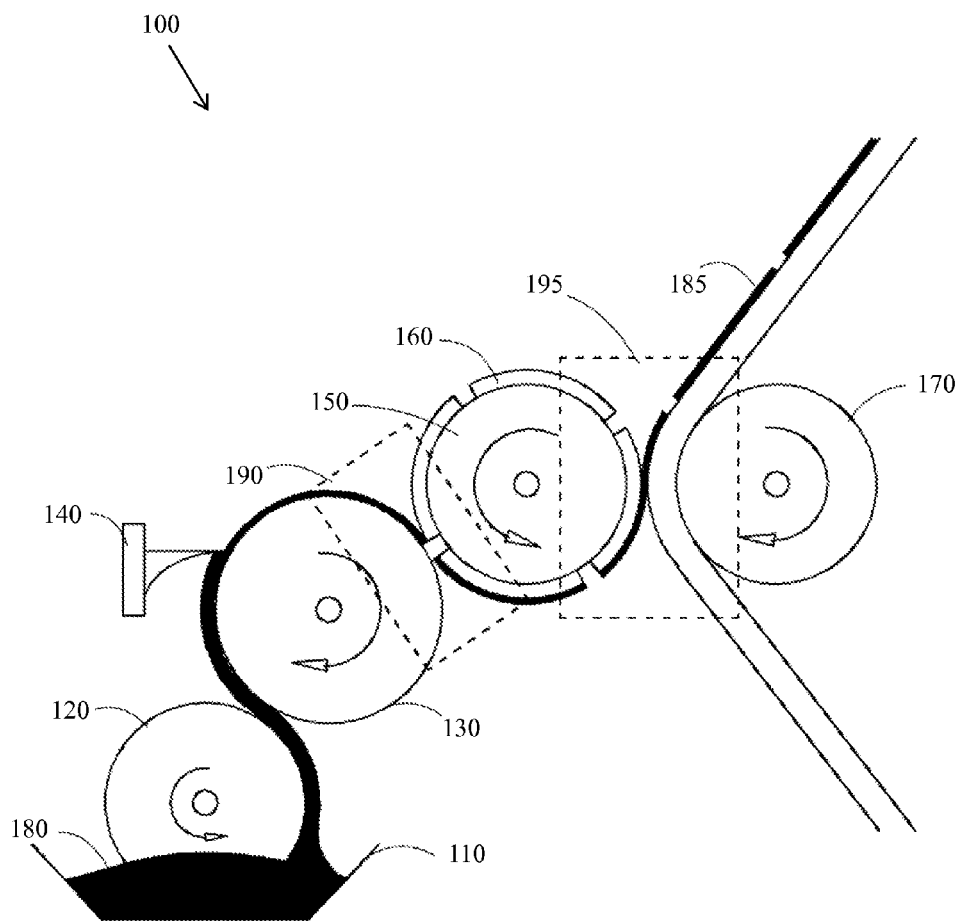
FIG. 1 shows a flexographic printing station in accordance with one or more embodiments of the present invention.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one of ordinary skill in the art are not described to avoid obscuring the description of the present invention.

A conventional flexographic printing system includes a flexo master with embossing patterns that transfer an image to a substrate. In some instances, the embossing patterns include one or more patterned lines or features having different widths or orientations. When the patterned lines or features have different widths, the patterned lines or features of the embossing patterns also have different heights. These height differentials may be a consequence of fabricating the flexo master with patterned lines or features with different widths. The height differentials give rise to a number of issues including non-uniform line widths and discontinuities of the printed patterned lines or printed features on the substrate. In addition, because a conventional flexographic printing system uses a flexo master that includes patterned lines or features with different widths or orientations, all patterned lines and features are subject to the same process parameters including speed, composition, viscosity, pressure, or volume of ink.

In one or more embodiments of the present invention, a multi-station flexographic printing system allows for roll-to-roll printing of micrometer-fine lines and features on a substrate with a visual indicator of alignment accuracy.

FIG. 1 shows a flexographic printing station 100 in accordance with one or more embodiments of the present invention. Flexographic printing station 100 may include an ink pan 110, an ink roll 120 (also referred to as a fountain roll), an anilox roll 130 (also referred to as a meter roll), a doctor blade 140, a printing plate cylinder 150, a flexo master 160 (also referred to as a flexographic printing plate), and an impression cylinder 170.

In operation, ink roll 120 transfers ink 180 from ink pan 110 to anilox roll 130. In one or more embodiments of the present invention, ink 180 may be a catalytic ink or catalytic alloy ink that serves as a base layer suitable for electroless plating. One of ordinary skill in the art will recognize that the composition of ink 180 may vary in accordance with one or more embodiments of the present invention. Anilox roll 130 is typically constructed of a steel or aluminum core that may be coated by an industrial ceramic whose surface contains a plurality of very fine dimples, known as cells (not shown).

Doctor blade 140 removes excess ink 180 from anilox roll 130. In transfer area 190, anilox roll 130 meters the amount of ink 180 transferred to printing plate cylinder 150 to a uniform thickness. Printing plate cylinder 150 may be generally made of metal and the surface may be plated with chromium, or the like, to provide increased abrasion resistance. Flexo master 160 may be mounted on printing plate cylinder 150. In one or more embodiments of the present invention, flexo master 160 may be composed of rubber or a photo-polymer.

One or more substrates 185 move between the printing plate cylinder 150 and impression cylinder 170. In one or more embodiments of the present invention, substrate 185 may be transparent. Transparent means the transmission of light with a transmittance rate of 90% or more. In one or more embodiments of the present invention, substrate 185 may be polyethylene terephthalate ("PET"), polyethylene naphthalate ("PEN"), cellulose acetate ("TAC"), linear low-density polyethylene ("LLDPE"), bi-axially-oriented polypropylene ("BOPP"), polyester, polypropylene, or glass. One of ordinary skill in the art will recognize that the composition of substrate 185 may vary in accordance with one or more embodiments of the present invention.

Impression cylinder 170 applies pressure to printing plate cylinder 150, transferring an image from embossing patterns of flexo master 160 onto substrate 185 at transfer area 195. The rotational speed of printing plate cylinder 150 is synchronized to match the speed at which substrate 185 moves through flexographic printing station 100. The speed may vary between 20 feet per minute to 750 feet per minute.

Figure 2:
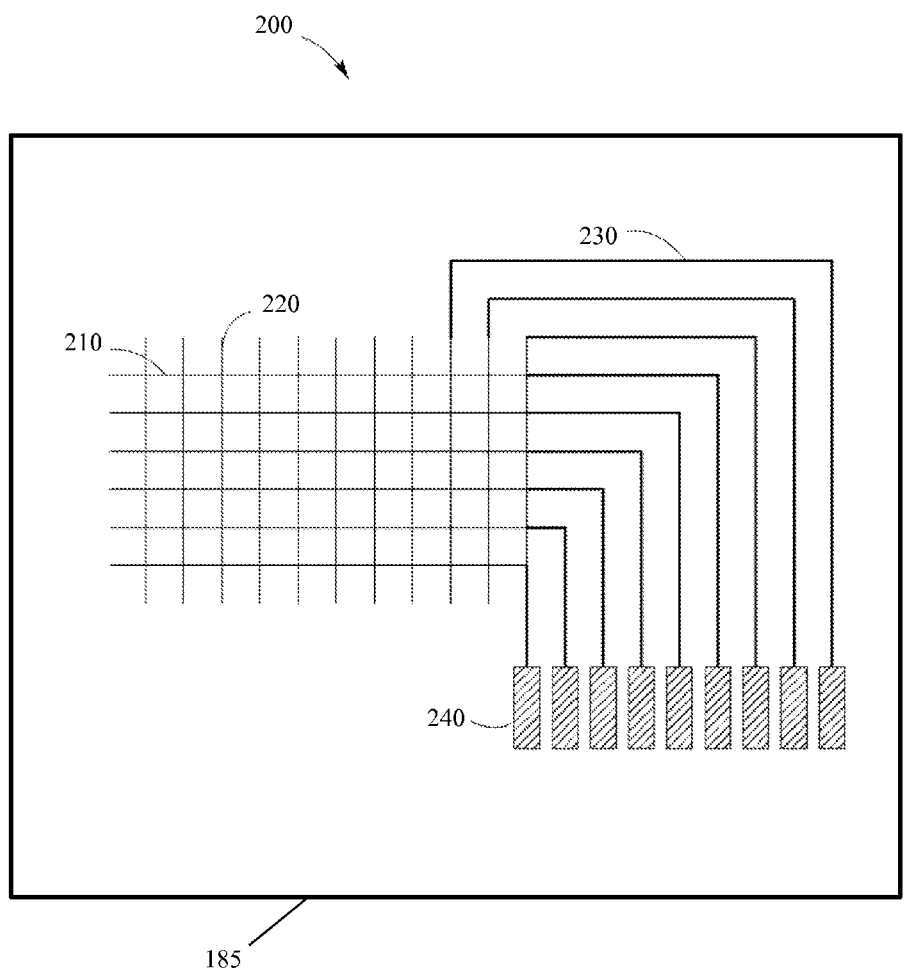
FIG. 2 shows a portion of a printed pattern design on substrate having junctions between lines or features of different widths or orientations in accordance with one or more embodiments of the present invention.

FIG. 2 shows a portion of a printed pattern design 200 on substrate having junctions between lines or features of different widths or orientations in accordance with one or more embodiments of the present invention. In one or more embodiments of the present invention, printed pattern design 200 may be used to form a touch sensor (not independently illustrated). In one or more embodiments of the present invention, printed pattern design 200 may include x-axis printed lines 210 and y-axis printed lines 220 connected by interconnects 230 to connectors 240 on substrate 185. Interconnects 230 may be used to route x-axis printed lines 210 and y-axis printed lines 220 to connectors 240. Connectors 240 may be configured to provide a connection to an interface (not shown) to a touch sensor controller (not shown). In one or more embodiments of the present invention, one or more of x-axis printed lines 210, y-axis printed lines 220, interconnects 230, and connectors 240 may have different line widths. In one or more embodiments of the present invention, one or more of x-axis printed lines 210, y-axis printed lines 220, interconnects 230, and connectors 240 may have different orientations. One of ordinary skill in the art will recognize that the configuration, location, and size of printed pattern design 200 may vary in accordance with one or more embodiments of the present invention.

In one or more embodiments of the present invention, x-axis printed lines 210 and y-axis printed lines 220 may have line widths less than approximately 10 micrometers. In one or more embodiments of the present invention, x-axis printed lines 210 and y-axis printed lines 220 may have line widths in a range between approximately 10 micrometers and approximately 50 micrometers. In one or more embodiments of the present invention, x-axis printed lines 210 and y-axis printed lines 220 may have line widths greater than approximately 50 micrometers. One of ordinary skill in the art will recognize that the shape and width of x-axis printed lines 210 and y-axis printed lines 220 may vary in accordance with one or more embodiments of the present invention.

In one or more embodiments of the present invention, interconnects 230 may have line widths in a range between approximately 50 micrometers and approximately 100 micrometers. One of ordinary skill in the art will recognize that the shape and width of interconnects 230 may vary in accordance with one or more embodiments of the present invention. In one or more embodiments of the present invention, connectors 240 may have line widths greater than approximately 100 micrometers. One of ordinary skill in the art will recognize that the shape and width of connectors 240 may vary in accordance with one or more embodiments of the present invention.

Figure 3:
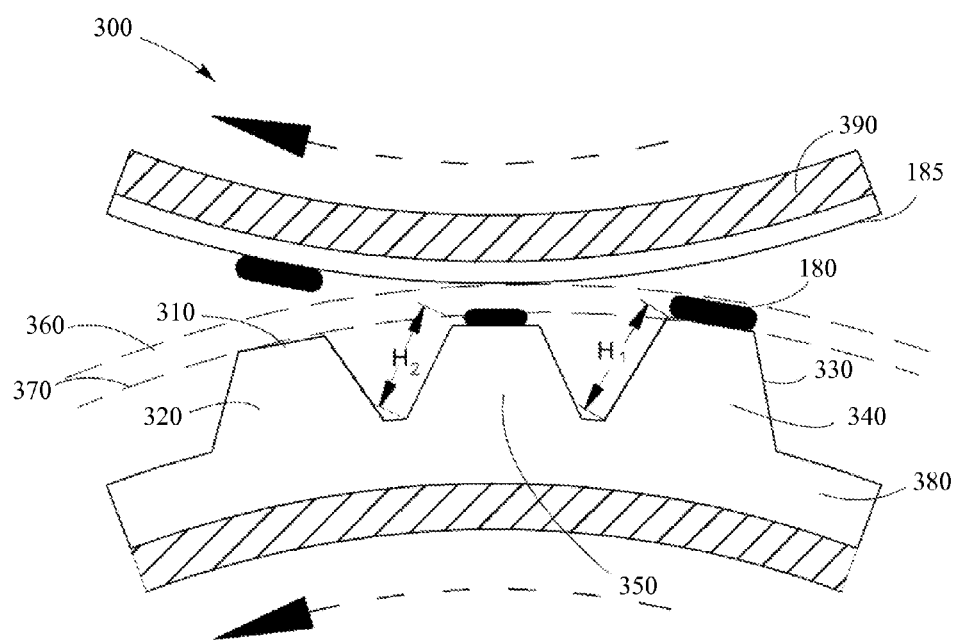
FIG. 3 shows a side view of a conventional flexo master with lines or features of different widths and heights.

FIG. 3 shows a side view 300 of a conventional flexo master 380 with lines or features of different widths or heights. Flexo master 380 includes raised printing surfaces 310 of patterned lines 320 that exhibit angled sidewalls 330. Ink 180 may be transferred from raised printing surfaces 310 to substrate 185 when impression cylinder 390 presses substrate 185 against raised printing surfaces 310 while flexo master 380 and impression cylinder 390 rotate.

Because patterned lines 320 exhibit different widths, they may exhibit different heights. The height differential of patterned lines 320 may be an inherent feature of flexo master 380 when patterned lines 320 have different widths. For example, patterned lines 340 may exhibit a height $H_1$, whereas patterned lines 350 may exhibit a different height $H_2$. Tall patterned lines 340 may pick up more ink 180 from anilox roll (not shown) and rotate along tall feature arc 360, which may exert more compression when transferring ink 180 to substrate 185. Conversely, short patterned lines 350 may pick up less ink 180 from the anilox roll (not shown) and rotate along small feature arc 370, which may exert less compression when transferring ink 180 to substrate 185. As a result, the height of patterned lines 320 impacts the amount of ink 180 transferred to substrate 185. Other factors may contribute to the height differential of patterned lines 320 including a mass differential under a given point of patterned lines 320. When patterned lines 320 swell from absorption of moisture, tall patterned lines 340 may swell more than short patterned lines 350 because of their higher density. As a result, printed patterned lines (not shown) on substrate 185 may exhibit significant line width variations that negatively affect printing performance. In addition, when a single flexo master 380 is used to print patterned lines with different widths, the same speed, composition, viscosity, pressure, and volume of ink must be used.

FIG. 4 shows a portion of a multi-station flexographic printing system 400 in accordance with one or more embodiments of the present invention. In one or more embodiments of the present invention, multi-station flexographic printing system 400 may include a plurality of flexographic printing stations 100 that each include an independent flexo master 160. In one or more embodiments of the present invention, multi-station flexographic printing system 400 may include a flexographic printing station 100, and associated flexo master 160, for each desired line width, feature, orientation, or printing side to minimize line width variations. One of ordinary skill in the art will recognize that the number of flexographic printing stations 100 of multi-station flexographic printing system 400 may vary in accordance with one or more embodiments of the present invention.

FIG. 4A shows a portion of a first flexographic printing station 100 of multi-station flexographic printing system 400. A first flexo master 160 comprises an embossing pattern. The embossing pattern may comprise patterned lines 450 configured for printing lines 210 in an x-axis direction on substrate 185. In one or more embodiments of the present invention, because each of patterned lines 450 of flexo master 160 are the same width, patterned lines 450 may have the same height.

FIG. 4B shows a portion of a second flexographic printing station 100 of a multi-station flexographic printing system 400. A second flexo master 160 comprises an embossing pattern. The embossing pattern may comprise patterned lines 460 configured for printing lines 220 in a y-axis direction on substrate 185. In one or more embodiments of the present invention, because each of patterned lines 460 of flexo master 160 are the same width, patterned lines 460 may have the same height.

FIG. 4C shows a portion of a third flexographic printing station 100 of a multi-station flexographic printing system 400. A third flexo master 160 comprises an embossing pattern. The embossing pattern may comprise patterned lines 470 configured for printing interconnect and/or connector patterns 230 on substrate 185. In one or more embodiments of the present invention, because each of patterned lines 470 of flexo master 160 are the same width, patterned lines 470 may have the same height.

In one or more embodiments of the present invention, the width of patterned lines 450, patterned lines 460, and patterned lines 470 may be different. In one or more embodiments of the present invention, the orientation of patterned lines 450, patterned lines 460, and patterned lines 470 may be different. In one or more embodiments of the present invention, the height of patterned lines 450, patterned lines 460, and patterned lines 470 may be the same. Because the height differential between patterned lines 450, patterned lines 460, and patterned lines 470 may be minimized, ink 180 may be more uniformly transferred from the anilox roll (not shown) to patterned lines 450, patterned lines 460, and patterned lines 470 resulting in uniform printing of the printed patterns on substrate 185.

In one or more embodiments of the present invention, the flexographic printing stations 100 of multi-station flexographic printing system 400 may be sequenced in an order suitable for a particular application. In one or more embodiments of the present invention, flexographic printing stations 100 of multi-station flexographic printing system 400 may be sequenced for printing on both sides of a substrate in an order suitable for a particular application. In one or more embodiments of the present invention, the flexographic printing stations 100 of multi-station flexographic printing system 400 may be sequenced to print lines or features of different widths or orientations in an order suitable for a particular application. In one or more embodiments of the present invention, the flexographic printing stations 100 of multi-station flexographic printing system 400 may be sequenced to print small lines or features before larger lines or features. One of ordinary skill in the art will recognize that the sequence of flexographic printing stations 100 of multi-station flexographic printing system 400 may vary in accordance with one or more embodiments of the present invention.

In one or more embodiments of the present invention, the use of different flexo masters 160 for each type of printed pattern allows for more efficient control of printing factors according to specific requirements of each printed pattern. For example, printed lines 210 in an x-axis direction may require a higher concentration of a plating catalyst in the ink 180 composition compared to wider printed connector patterns 240. As a result, the flexographic printing station 100 depicted in FIG. 4A may use a higher concentration of plating catalyst compared to other flexographic printing stations 100.

In one or more embodiments of the present invention, multi-station flexographic printing system 400 may include one or more UV curing modules (not shown). A UV curing module may include a UV light source that initiates the polymerization of acrylic groups within the ink 180 composition in the printed patterns. The UV curing module may include a UV light source that activates the plating catalyst within the ink 180 composition in the printed patterns. In certain embodiments, the ink 180 composition may include metal nanoparticles that may not require a plating catalyst or UV activation.

In one or more embodiments of the present invention, multi-station flexographic printing system 400 may include one or more electroless plating baths (not shown). An electroless plating bath may deposit a layer of conductive material on one or more of printed lines 210, printed lines 220, printed interconnects 230, and printed connectors 240 on substrate 185. In certain embodiments, a different type of conductive material may be used for one or more of printed lines 210 in an x-axis direction, printed lines 220 in a y-axis direction, interconnect patterns 230, and connectors 240.

In one or more embodiments of the present invention, a different ink 180 composition may be used for one or more flexo masters 160 of one or more flexographic printing stations 100 of multi-station flexographic printing system 400. In one or more embodiments of the present invention, the ink 180 composition for one or more flexo masters 160 may be varied to achieve a desired fabrication of substrate 185. In one or more embodiments of the present invention, one or more process parameters including speed, composition, viscosity, pressure, and volume of ink 180 may be varied for one or more flexographic printing stations 100.

In certain embodiments, a multi-station flexographic printing system 400 may include six flexographic printing stations 100. Three flexographic printing stations 100 may be used for printing x-axis, y-axis, and interconnect and/or connector lines and patterns on a first side of a substrate 185 and three flexographic printing stations 100 may be used for printing x-axis, y-axis, and interconnect and/or connector lines and patterns on a second side of the substrate 185.

In one or more embodiments of the present invention, a sequence of flexographic printing stations 100 may vary depending on the application. In certain embodiments, for example, x-axis lines may be printed on a first side of a substrate 185 by a first flexographic printing station 100 and then x-axis lines may be printed on a second side of the substrate 185 by a second flexographic printing station 100. As the process continues, y-axis lines may be printed on the first side of the substrate 185 by a third flexographic printing station 100 and then y-axis lines may be printed on the second side of the substrate 185 by a fourth flexographic printing station 100. Finally, interconnects and/or connectors may be printed on the first side of the substrate 185 by a fifth flexographic printing station 100 and then interconnects and/or connectors may be printed on the second side of the substrate 185 by a sixth flexographic printing station 100. One of ordinary skill in the art will recognize that the sequence of flexographic printing stations 100 of multi-station flexographic printing system 400 may vary in accordance with one or more embodiments of the present invention.

In certain embodiments, the substrate with x-axis, y-axis, and interconnect and/or connector patterns disposed on both sides of the substrate may form a capacitive touch sensor (not shown). To ensure proper operation of the touch sensor, the x-axis, y-axis, and interconnect and/or connector patterns on the substrate 185 must be properly aligned in machine and transverse direction with respect to one another. Because the system 400 may include a plurality of flexographic printing stations 100, the flexographic printing stations 100 must be aligned to one another to ensure the x-axis, y-axis, and interconnect and/or connector patterns are properly aligned on the substrate 185. Alignment is more difficult when the printed lines or features have micrometer-fine line widths.

Figure 5:
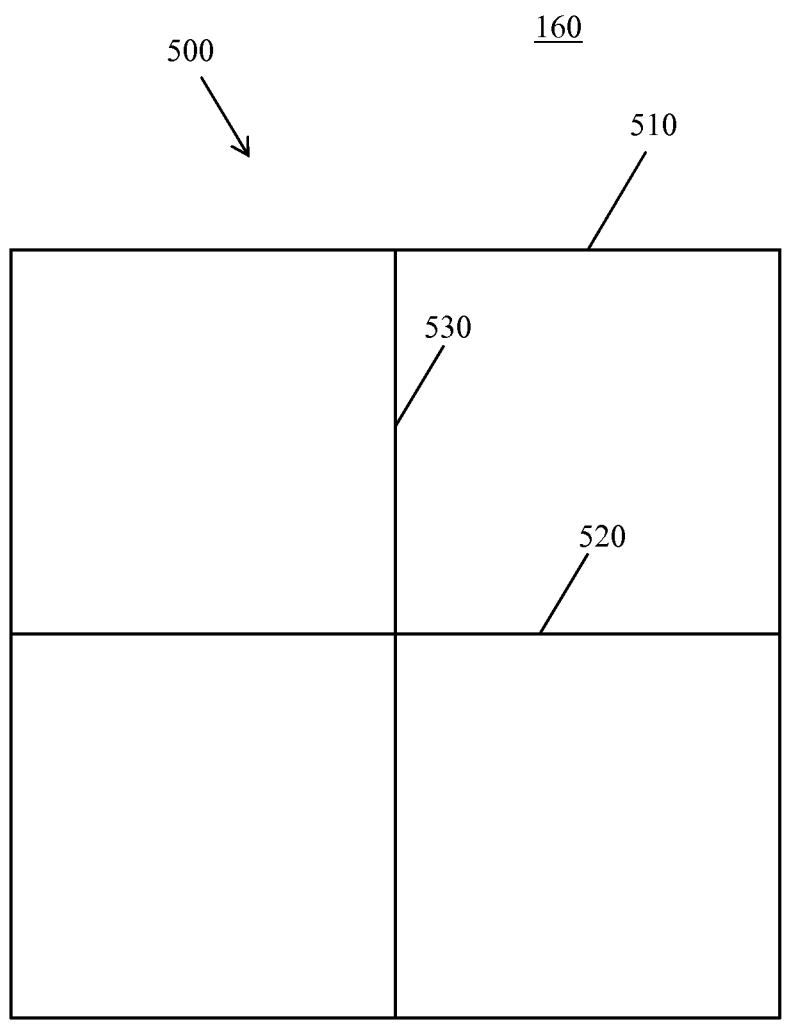
FIG. 5 shows an alignment box in accordance with one or more embodiments of the present invention.

FIG. 5 shows an alignment box 500 in accordance with one or more embodiments of the present invention. In one or more embodiments of the present invention, alignment box 500 may be an embossing pattern disposed on a flexo master 160 and printed on substrate (185 of FIG. 1) by one or more flexographic printing stations (100 of FIG. 1) of multi-station flexographic printing system (400 of FIG. 4). Alignment box 500 may include a substantially square or rectangular frame 510 that may be disposed in a bearer bar area (not shown) of flexo master 160. The bearer bar area may be a substantially rectangular area disposed along an edge of flexo master 160. The bearer bar area may include patterns or features that may facilitate printing operations. The bearer bar area may provide additional support for the interaction between flexo master 160 and anilox roll (130 of FIG. 1) during printing operations. Alignment box 500 may be any shape or size suitable for location in the bearer bar area of flexo master 160. In certain embodiments, alignment box 500 may be ½ A inch square. Alignment box 500 may include x-axis crosshair 520 and y-axis crosshair 530. In certain embodiments, each of crosshairs 520 and 530 may have a line width of approximately 20 micrometers or less. One of ordinary skill in the art will recognize that the configuration, location, and shape of alignment box 500 may vary in accordance with one or more embodiments of the present invention. One or more alignment boxes 500 may be disposed on flexo master 160 in one or more unique positions. For example, if there are six flexographic printing stages (100 of FIG. 1) in a multi-station flexographic printing system (400 of FIG. 4) that are used to print on a substrate (185 of FIG. 1), then five alignment boxes 500 may be disposed on flexo master 160 in five unique positions.

Figure 6:
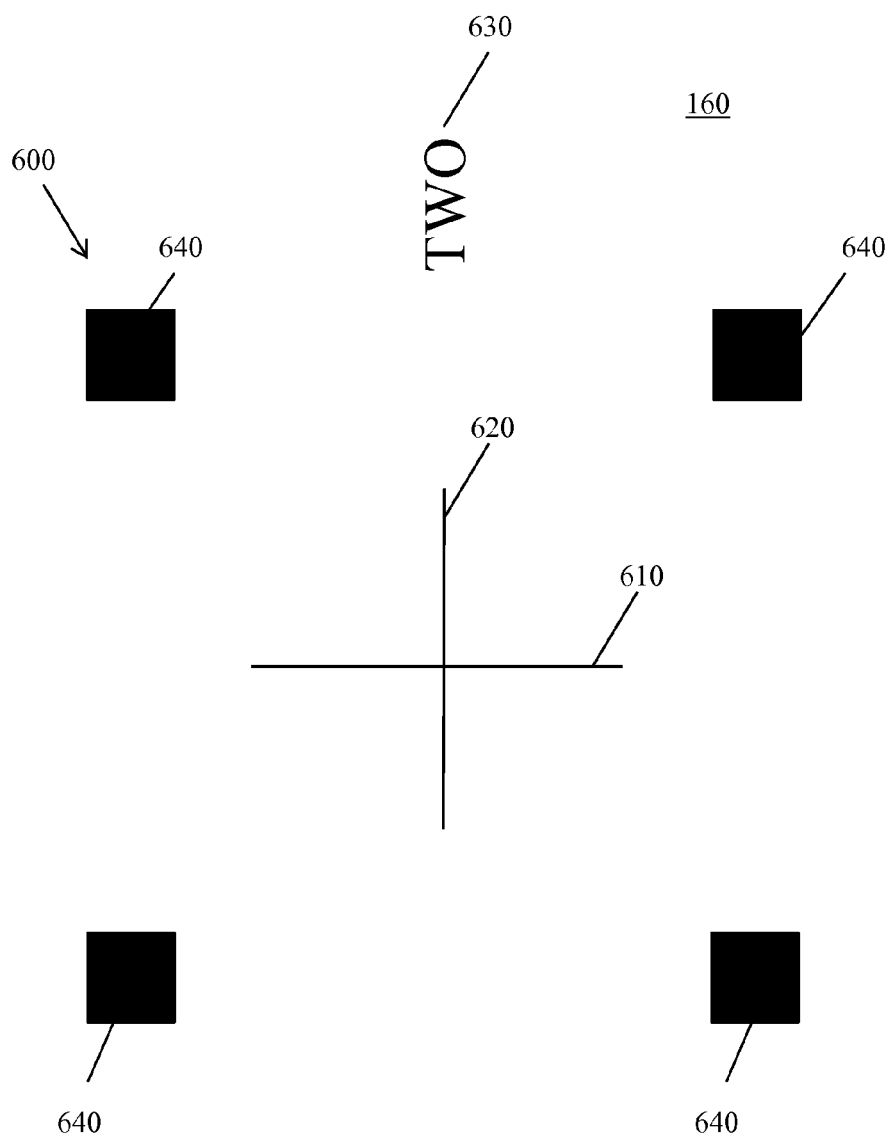
FIG. 6 shows an alignment box completion in accordance with one or more embodiments of the present invention.

FIG. 6 shows an alignment box completion 600 in accordance with one or more embodiments of the present invention. In one or more embodiments of the present invention, alignment box completion 600 may be an embossing pattern disposed on a flexo master 160 and printed on substrate (185 of FIG. 1) by one or more flexographic printing stations (100 of FIG. 1) of multi-station flexographic printing system (400 of FIG. 4). Alignment box completion 600 may include x-axis alignment crosshair 610 and y-axis alignment crosshair 620. In certain embodiments, each of alignment crosshairs 610 and 620 may have a line width of approximately 20 micrometers or less. Alignment box completion 600 may include a station identifier 630. In certain embodiments, station identifier 630 may be a number identifying the flexographic printing station (100 of FIG. 1) that printed the station identifier 630. In other embodiments, station identifier 630 may be a word or phrase identifying the flexographic printing station (100 of FIG. 1) that printed the station identifier 630. Alignment box completion 600 may include a plurality of completion boxes 640. Completion boxes 640 may be disposed in locations corresponding to the corners of alignment box (500 of FIG. 5) frame (510 of FIG. 5). One of ordinary skill in the art will recognize that the configuration, location, and shape of alignment box completion 600 may vary in accordance with one or more embodiments of the present invention. In certain embodiments, an alignment box completion 600 may be disposed on a flexo master 160 in a predetermined position corresponding to a unique position of a corresponding alignment box (500 of FIG. 5) disposed on another flexo master (160 of FIG. 1).

One of ordinary skill in the art will recognize that alignment boxes 500 and alignment box completions 600 may be formed on one or more flexo masters 160 by a conventional flexo master fabrication process. For example, alignment boxes 500 or alignment box completions 600 may be designed in a computer-aided drafting software application and exported to a standardized file format, such a Tagged Image File Format ("TIFF"). The TIFF file may be input to a thermal imaging system to produce a thermal imaging layer. The thermal imaging layer may be used to form alignment boxes 500 or an alignment box completion 600 on a flexo master substrate by a laser ablation process. Because a matched pair of alignment box 500 and alignment box completion 600 are designed in the computer-aided drafting software application that generates the thermal imaging layer, each matched pair of alignment box 500 and alignment box completion 600 may be precisely located on their respective flexo masters 160. This allows for the fabrication of a flexo master 160 with one or more alignment boxes 500 in unique positions and one or more flexo masters 160 with alignment box completions 600 in predetermined positions corresponding to their respective alignment boxes 500.

Figure 7:
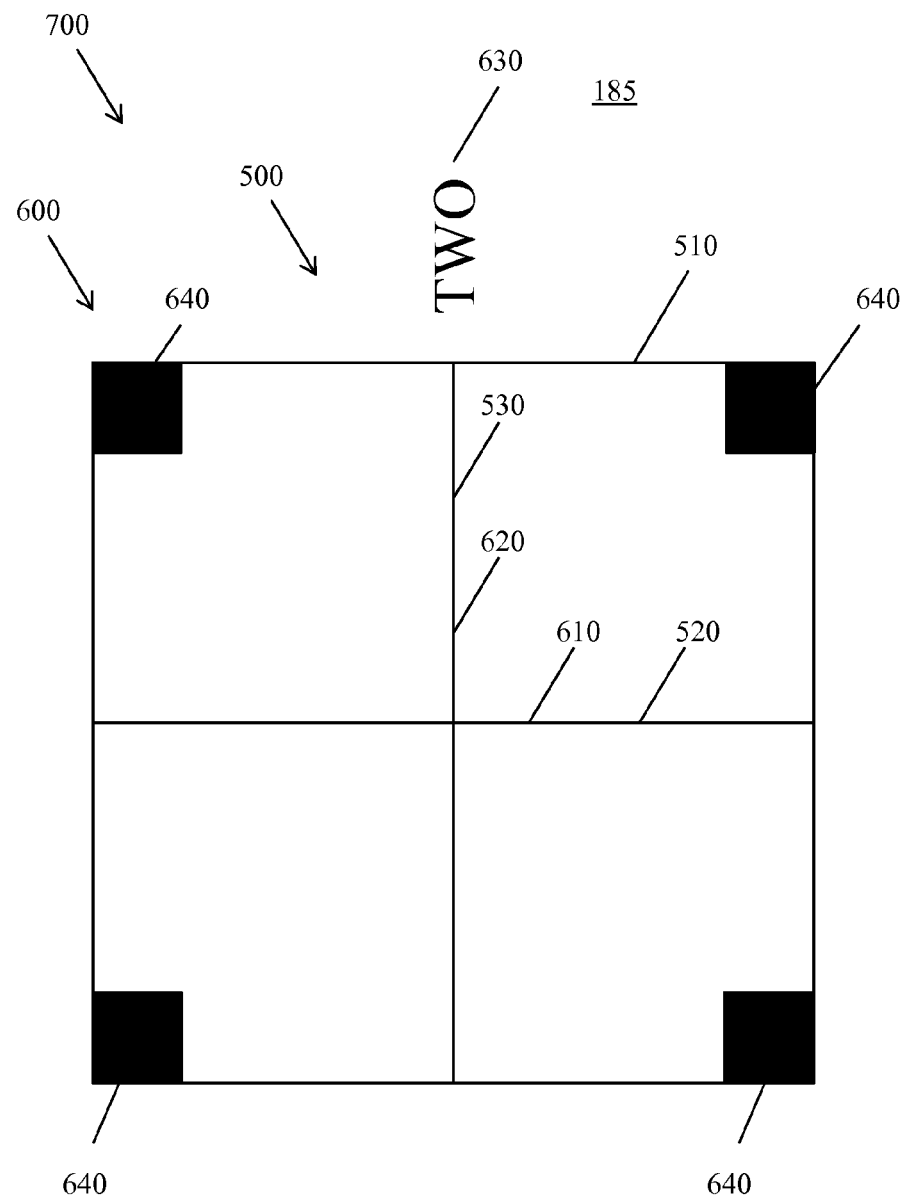
FIG. 7 shows an aligned alignment box and alignment box completion printed on a substrate in accordance with one or more embodiments of the present invention.

FIG. 7 shows an aligned alignment box and alignment box completion 700 printed on a substrate in accordance with one or more embodiments of the present invention. In certain embodiments, during printing operations, a first flexographic printing station (100 of FIG. 1) may print an alignment box 500 on a substrate 185. A subsequent flexographic printing station (100 of FIG. 1) may print an alignment box completion 600 on substrate 185 in a position corresponding to the previously printed alignment box 500. When the flexographic printing stations are aligned, the printed x-axis crosshair 520 may be aligned with the printed x-axis alignment crosshair 610. Similarly, when the flexographic printing stations are aligned, the printed y-axis crosshair 530 may be aligned with the printed y-axis alignment crosshair 620. Station identifier 630 may be printed on substrate 185 in a predetermined position that may vary depending on the application. Completion boxes 640 may be printed on substrate 185 in the corners of printed alignment box 500 frame 510.

In operation, when a first flexographic printing station (100 of FIG. 1) prints an alignment box 500 on a substrate 185, a subsequent flexographic printing station (100 of FIG. 1) may print a corresponding alignment box completion 600 on the substrate 185 to provide a visual indication of alignment. For example, an alignment of the first flexographic printing station (100 of FIG. 1) and the subsequent flexographic printing station (100 of FIG. 1) may be visually determined by comparing the location of printed alignment box completion 600 relative to printed alignment box 500 on the substrate. In certain embodiments, one or more flexographic printing stations may be aligned with an accuracy of approximately 10 micrometers or less based on visual alignment using one or more alignment boxes 500 and one or more alignment box completions 600.

Figure 8:
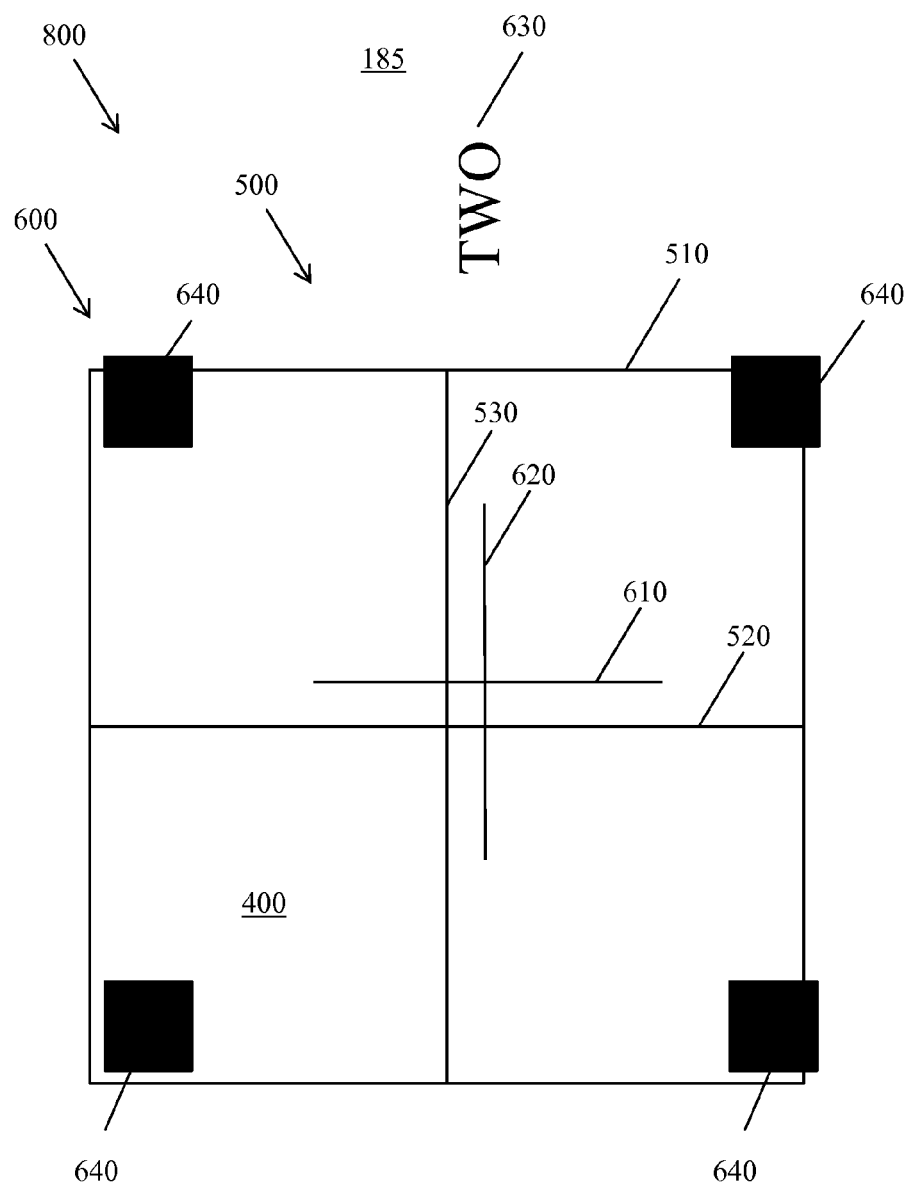
FIG. 8 shows a misaligned alignment box and alignment box completion printed on a substrate in accordance with one or more embodiments of the present invention.

FIG. 8 shows a misaligned alignment box and alignment box completion 800 printed on a substrate in accordance with one or more embodiments of the present invention. In certain embodiments, during printing operations, a first flexographic printing station (100 of FIG. 1) may print an alignment box 500 on a substrate 185. A subsequent flexographic printing station (100 of FIG. 1) may print an alignment box completion 600 on the substrate in a misaligned position relative to the previously printed alignment box 500. The misalignment may be evident by an offset of one or more of x-axis alignment crosshair 610, y-axis alignment crosshair 620, station identifier 630, and completion boxes 640 relative to alignment box 500 including frame 510, x-axis crosshair 520, and y-axis crosshair 530. Because the subsequent flexographic printing station (100 of FIG. 1) is misaligned relative to the first flexographic printing station (100 of FIG. 1), the printed x-axis alignment crosshair 610 may not align with the printed x-axis crosshair 520. Similarly, the printed y-axis alignment crosshair 620 may not align with the printed y-axis crosshair 530. Station identifier 630 may be printed on substrate 185 in a position that is offset from its predetermined position. Completion boxes 640 may be printed on substrate 185 in a position that is offset relative to the corners of printed alignment box 500 frame 510.

In operation, when a first flexographic printing station (100 of FIG. 1) prints an alignment box 500 on a substrate 185, a subsequent flexographic printing station (100 of FIG. 1) may print a corresponding alignment box completion 600 on the substrate 185 to provide a visual indication of alignment. For example, a misalignment of the subsequent flexographic printing station (100 of FIG. 1) relative to the first flexographic printing station (100 of FIG. 1) may be visually determined by comparing the location of printed alignment box completion 600 relative to printed alignment box 500 on the substrate. The misalignment of printed alignment box completion 600 relative to printed alignment box 500 may indicate an adjustment needs to be made to the subsequent flexographic printing station (100 of FIG. 1) and/or the first flexographic printing station (100 of FIG. 1) to correct the misalignment.

Figure 9A:
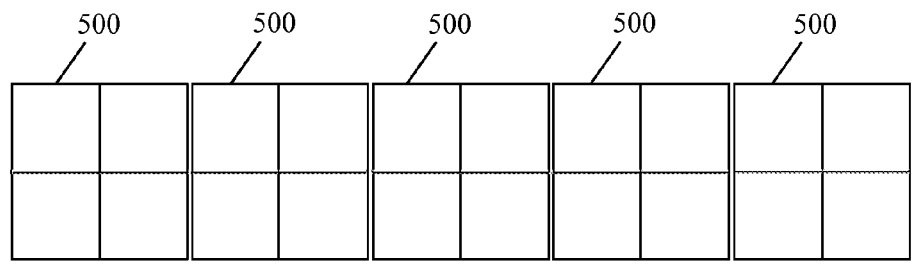
FIG. 9 shows aligned pairs of alignment boxes and alignment box completions printed on a substrate in accordance with one or more embodiments of the present invention.
Figure 9B:
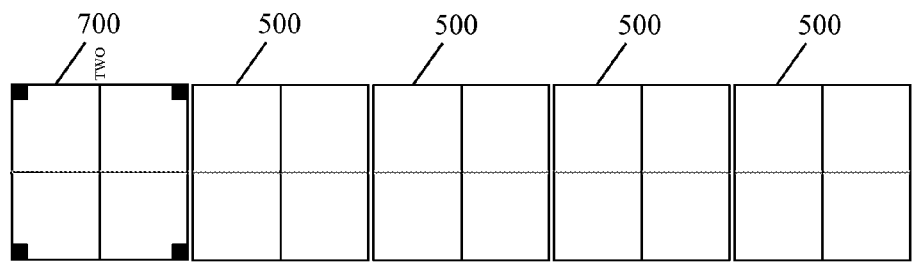

FIG. 9 shows aligned pairs of alignment boxes and alignment box completions printed on a substrate in accordance with one or more embodiments of the present invention. In FIG. 9A, during printing operations, a first flexographic printing station (100 of FIG. 1) may print one or more alignment boxes 500 on a substrate 185 in one or more unique positions. In certain embodiments, the first flexographic printing station (100 of FIG. 1) may print an alignment box 500 on substrate 185 in a unique position for each flexographic printing station (100 of FIG. 1) used in multi-station flexographic printing system (400 of FIG. 4). Continuing in FIG. 9B, a second flexographic printing station (100 of FIG. 1) may print an alignment box completion (600 of FIG. 6) on substrate 185 in a predetermined position that corresponds to a unique position of a corresponding alignment box 500 forming an aligned alignment box and alignment box completion 700. Each subsequent flexographic printing stations (100 of FIG. 1) may print an alignment box completion (600 of FIG. 6) on substrate 185 in a predetermined position corresponding to a unique position of an alignment box (500 of FIG. 5) for the respective station (100 of FIG. 1).

Figure 9C:
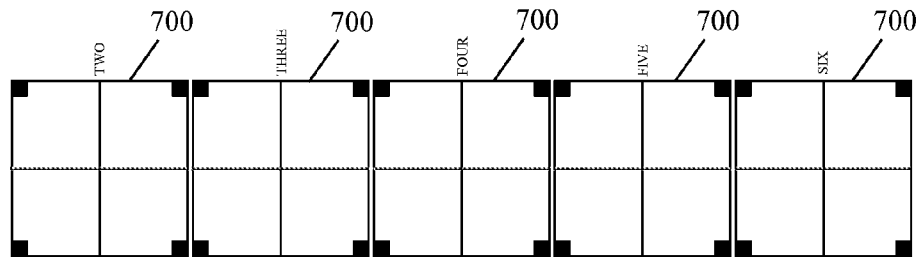

Continuing in FIG. 9C, a third flexographic printing station (100 of FIG. 1), a fourth flexographic printing station (100 of FIG. 1), a fifth flexographic printing station (100 of FIG. 1), and a sixth flexographic printing station (100 of FIG. 1) may each print an alignment box completion (600 of FIG. 6) on substrate 185 in a predetermined position corresponding to a unique position of an alignment box (500 of FIG. 5) for their respective station (100 of FIG. 1). In certain embodiments, one or more of the flexographic printing stations (100 of FIG. 1) may be configured to print on a first side of substrate 185 and one or more of the flexographic printing stations (100 of FIG. 1) may be configured to print on a second side of substrate 185. In embodiments where substrate 185 is transparent, the transparency of substrate 185 allows for the same display of information even when one or more alignment boxes 500 and/or alignment box completions (600 of FIG. 6) are printed on opposing sides of substrate 185. One of ordinary skill in the art will recognize that a number and sequence of flexographic printing stations (100 of FIG. 1) may vary in accordance with one or more embodiments of the present invention.

When the flexographic printing stations are aligned, the printed x-axis crosshairs (520 of FIG. 5) may be aligned with the printed x-axis alignment crosshairs (610 of FIG. 6). Similarly, the printed y-axis crosshairs (530 of FIG. 5) may be aligned with the printed y-axis alignment crosshairs (620 of FIG. 6). Station identifiers (630 of FIG. 6) may be printed on substrate 185 in a predetermined position that may vary depending on the application. In certain embodiments, each flexographic printing station (100 of FIG. 1) may use a unique station identifier (630 of FIG. 6) identifying the flexographic printing station (100 of FIG. 1) that printed it. Completion boxes (640 of FIG. 6) may be printed on substrate 185 in the corners of each printed alignment box 500 frame (510 of FIG. 5).

In operation, each aligned alignment box and alignment box completion 700 may provide a visual indication of alignment. For example, an alignment of each flexographic printing station (100 of FIG. 1) relative to a first flexographic printing station may be visually determined by comparing the location of each printed alignment box completion (600 of FIG. 6) relative to its respective printed alignment box (500 of FIG. 5) on substrate 185.

Figure 10A:
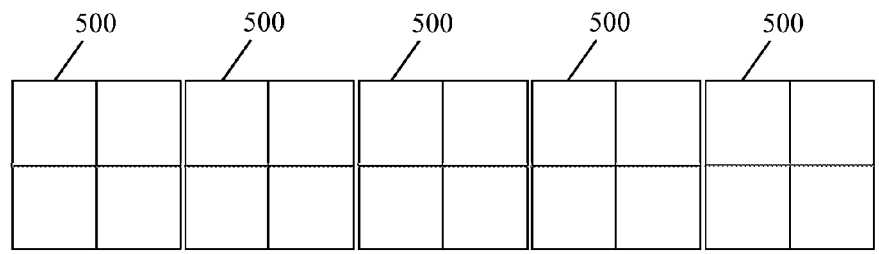
FIG. 10 shows misaligned pairs of alignment boxes and alignment box completions printed on a substrate in accordance with one or more embodiments of the present invention.
Figure 10B:
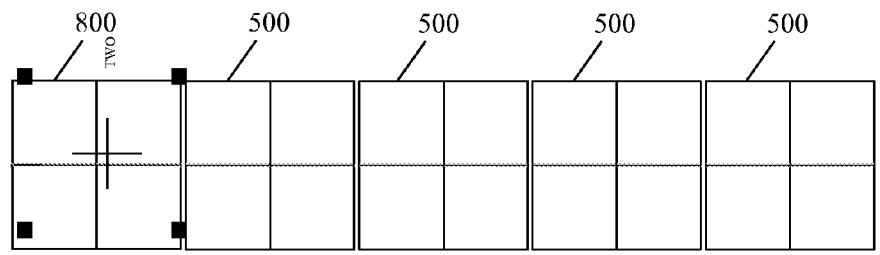

FIG. 10 shows misaligned pairs of alignment boxes and alignment box completions printed on a substrate in accordance with one or more embodiments of the present invention. In FIG. 10A, during printing operations, a first flexographic printing station (100 of FIG. 1) may print one or more alignment boxes 500 on a substrate 185 in one or more unique positions. In certain embodiments, the first flexographic printing station (100 of FIG. 1) may print an alignment box 500 on substrate 185 in a unique position for each flexographic printing station (100 of FIG. 1) used in multi-station flexographic printing system (400 of FIG. 4). Continuing in FIG. 10B, a second flexographic printing station (100 of FIG. 1) may print an alignment box completion (600 of FIG. 6) on substrate 185 in a predetermined position that corresponds to a unique position of a corresponding alignment box forming a misaligned alignment box and alignment box completion 800. The misalignment may be evident by an offset of one or more of x-axis alignment crosshair (610 of FIG. 6), y-axis alignment crosshair (620 of FIG. 6), station identifier (630 of FIG. 6), or completion boxes (640 of FIG. 6) relative to alignment box 500 including frame (510 of FIG. 5), x-axis crosshair (520 of FIG. 5), and y-axis crosshair (530 of FIG. 5).

Figure 10C:
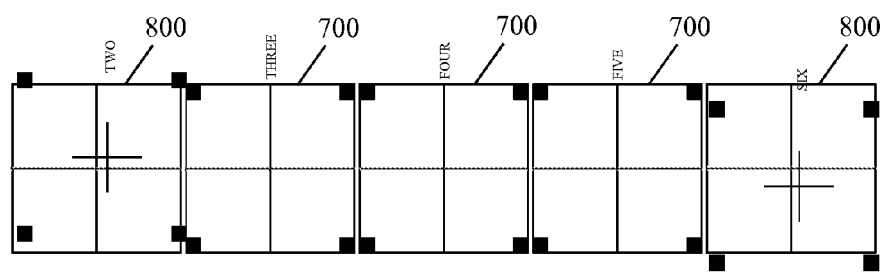

Continuing in FIG. 10C, subsequent flexographic printing stations (100 of FIG. 1) may print alignment box completions (600 of FIG. 6) on substrate 185 in predetermined positions for the respective stations (100 of FIG. 1). For example, a third flexographic printing station (100 of FIG. 1), a fourth flexographic printing station (100 of FIG. 1), a fifth flexographic printing station (100 of FIG. 1), and a sixth flexographic printing station (100 of FIG. 1) may each print an alignment box completion (600 of FIG. 6) on substrate 185 in a predetermined position that corresponds to a unique position of a corresponding alignment box (500 of FIG. 5).

In operation, each misaligned alignment box and alignment box completion 800 may provide a visual indication of misalignment. The misalignment of one or more flexographic printing stations (100 of FIG. 1) relative to a first flexographic printing station (100 of FIG. 1) may be visually determined by comparing the location of each printed alignment box completion (600 of FIG. 6) relative to its respective printed alignment box (500 of FIG. 5) on substrate 185.

Figure 11:
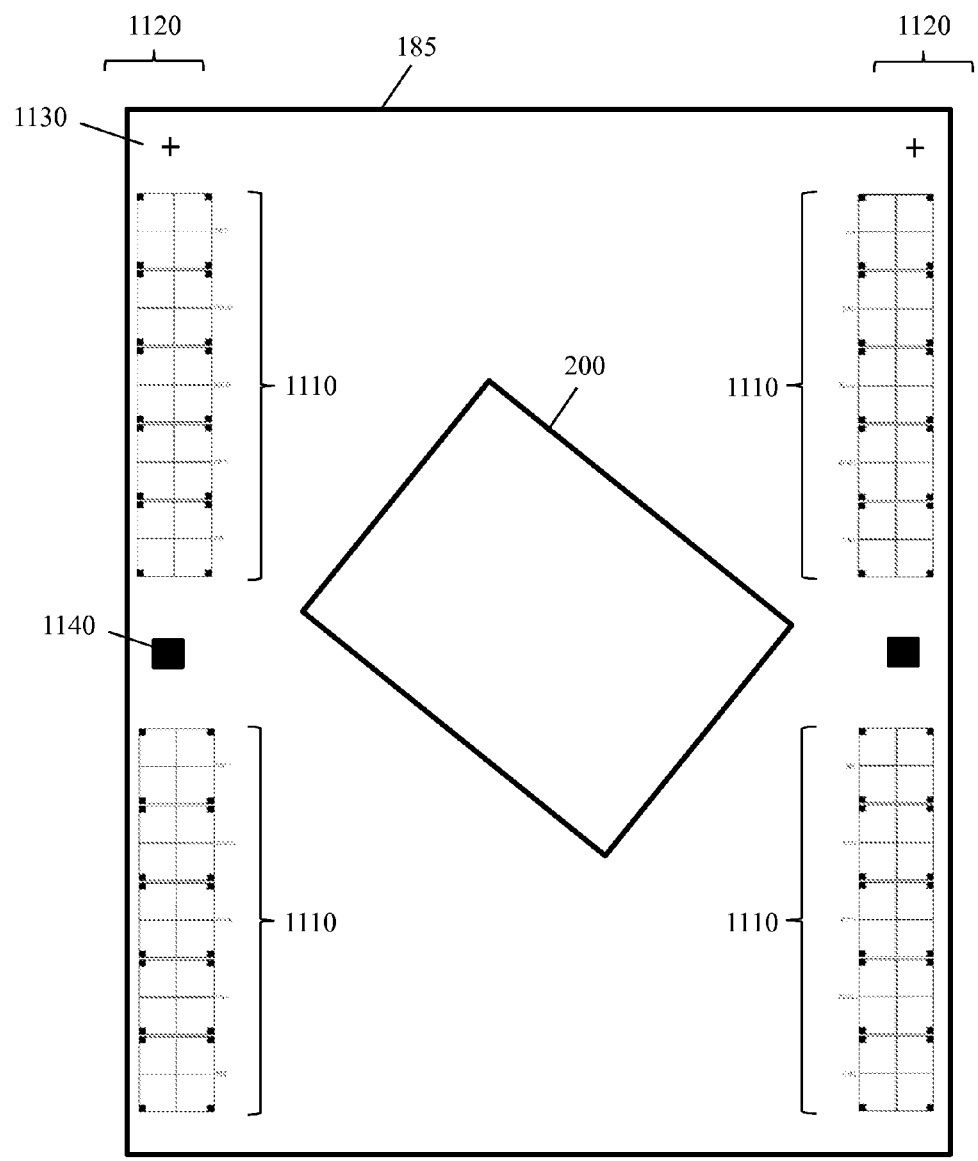
FIG. 11 shows a plurality of alignment boxes and alignment box completions printed on a substrate in accordance with one or more embodiments of the present invention.

FIG. 11 shows a plurality of alignment boxes and alignment box completions printed on a substrate in accordance with one or more embodiments of the present invention. A printed substrate 185 may include a printed patterned design 200. Printed pattern design 200 may be used to form a touch sensor (not independently illustrated). As noted above, one or more flexo masters (160 of FIG. 1) of the flexographic printing stations (100 of FIG. 1) of multi-station flexographic printing system (400 of FIG. 4) may include a bearer bar area to facilitate printing operations. As a consequence, patterns disposed in the bearer bar areas of the flexo masters (160 of FIG. 1) are printed on substrate 185 in printed bearer bar areas 1120. In certain embodiments, a plurality of alignment boxes and alignment box completions 1110 may be printed in bearer bar areas 1120 on substrate 185. In other embodiments, the plurality of alignment boxes and alignment box completions 1110 may be printed anywhere on substrate 185 suitable for a particular application. The bearer bar areas 1130 may include other marks used by the multi-station flexographic printing system (400 of FIG. 4) including various optical alignment marks 1130 and optical flexo master home registration marks 1140. During print operations, one or more flexographic printing stations (100 of FIG. 1) may use optical alignment marks 1130 to adjust operational parameters. One or more flexo masters (160 of FIG. 1) may use optical flexo master home registration marks 1140 to ensure print registration at a flexo master (160 of FIG. 1) is correct relative to the flexo master's home location. In certain embodiments, this prevents stretch and slack from station (100 of FIG. 1) to station (100 of FIG. 1).

Because the plurality of alignment boxes and alignment box completions 110 are disposed on an edge of substrate 185, they may be visually inspected during printing operations. In addition, because the plurality of alignment boxes and alignment box completions 110 are disposed on an edge of substrate 185, they may be cut and removed from substrate 185 for visual inspection using a microscope without damaging the printed patterned design area 200 of substrate 185.

Figure 12:
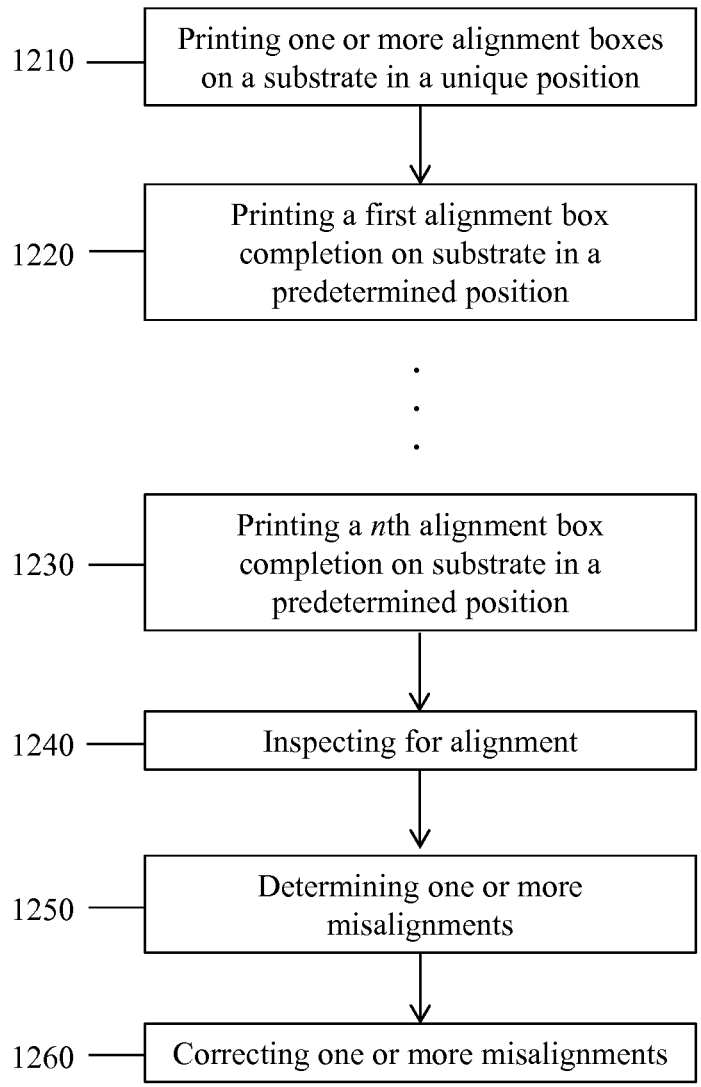
FIG. 12 shows a method of marking a substrate for visual alignment in accordance with one or more embodiments of the present invention.

FIG. 12 shows a method of marking a substrate for visual alignment in accordance with one or more embodiments of the present invention. In step 1210, a first flexographic printing station of a multi-station flexographic printing system may print one or more alignment boxes on a substrate, where each alignment box is printed on the substrate in a unique position. Each alignment box may include a frame, x-axis crosshair, and y-axis crosshair. One of ordinary skill in the art will recognize that the configuration, shape, and location of each alignment box may vary in accordance with one or more embodiments of the present invention. In certain embodiments, the first flexographic printing station may print an alignment box for each subsequent flexographic printing station in the system that will also print on the substrate as part of the printing operation. In certain embodiments, the alignment boxes may be printed on the substrate in a printed bearer bar area of the substrate. In other embodiments, the alignment boxes may be printed anywhere on the substrate suitable for a particular application.

In step 1220, a second flexographic printing station of the multi-station flexographic printing system may print a first alignment box completion on the substrate in a predetermined position corresponding to a unique position of a first printed alignment box. The alignment box completion may include x-axis alignment crosshair, y-axis alignment crosshair, station identifier, and completion boxes. One of ordinary skill in the art will recognize that the configuration, shape, and location of each alignment box completion may vary in accordance with one or more embodiments of the present invention. When the second flexographic printing station is aligned with respect to the first flexographic printing station, the x-axis alignment crosshair and y-axis alignment crosshair of the alignment box completion aligns with the x-axis crosshair and y-axis crosshair of the alignment box for the second flexographic printing station. In addition, the completion boxes of the alignment box completion are aligned in the corners of a frame of the alignment box for the second flexographic printing station.

In step 1230, the process of step 1220 is repeated for each additional flexographic printing station in the system that will also print on the substrate as part of the printing operation. In certain embodiments, a third flexographic printing station may print a second alignment box completion on the substrate in predetermined position corresponding to a unique position of the second printed alignment box, a fourth flexographic printing station may print a third alignment box completion on the substrate in a predetermined position corresponding to a unique position of a third printed alignment box, a fifth flexographic printing station may print a fourth alignment box completion on the substrate in a predetermined position corresponding to a unique position of a fourth printed alignment box, and a sixth flexographic printing station may print a fifth alignment box completion on the substrate in a predetermined position corresponding to a unique position of a fifth printed alignment box. One of ordinary skill in the art will recognize that the process of step 1220 may be repeated for each additional flexographic printing station in the system that will also print on the substrate as part of the printing operation.

In step 1240, an operator may visually inspect an alignment of one or more flexographic printing stations in the system. The operator may visually inspect an alignment at any station of the system. For example, the operator may visually inspect an alignment at the second flexographic printing station to determine the alignment of the second flexographic printing station relative to the first flexographic printing station. The operator may visually inspect an alignment at a third flexographic printing station to determine the alignment of the third flexographic printing station relative to the first flexographic printing station. This visual inspection may continue at each flexographic printing station in the system that will also print on the substrate as part of the printing operation. In this way, each flexographic printing station in the system may be aligned to the first flexographic printing station, and by extension, to each other.

In step 1250, an operator may determine a magnitude of one or more misalignments. In certain embodiments, the operator may cut and remove a portion of the substrate that includes one or more alignment boxes and alignment box completions. The operator may visually determine a magnitude of one or more misalignments by visually inspecting the misalignment of one or more alignment box completions relative to one or more of its corresponding alignment boxes under a microscope. A magnitude of misalignment of any flexographic printing station may be determined relative to a first flexographic printing station. The misalignment may be in a machine direction, i.e., direction of substrate flow through the system, or a transverse direction, i.e., perpendicular to direction of substrate flow through the system. A misalignment may be in both the machine direction and the transverse direction. Each flexographic printing station may be misaligned relative to the first flexographic printing station in a different way. In other embodiments, the operator may visually estimate a magnitude of misalignment.

In step 1260, an operator may correct one or more misalignments by adjusting an operational parameter of one or more flexographic printing stations. In certain embodiments, an operator may use a previously determined magnitude of misalignment to adjust a flexographic printing station relative to a first flexographic printing station. In this way, the operator may correct one or more misalignments on a station-by-station basis. For example, an operator may determine that a third flexographic printing station is misaligned by 30 micrometers in a machine direction relative to a first flexographic printing station. The operator may adjust the alignment of the third flexographic printing station by inputting the 30 micrometers as an offset in the machine direction. This process may continue for as many flexographic printing stations that are misaligned relative to the first flexographic printing station.

Advantages of one or more embodiments of the present invention may include one or more of the following:

In one or more embodiments of the present invention, a method and system of marking a substrate for visual alignment may be used in production as part of quality assurance testing. As substrates are printed, an operator may visually inspect alignment boxes and alignment box completions for proper alignment.

In one or more embodiments of the present invention, a method and system of marking a substrate for visual alignment may improve alignment accuracy. A first flexographic printing station may print one or more alignment boxes and each subsequent flexographic printing station that prints on the substrate may print an alignment box completion in its predetermined alignment box. Each subsequent flexographic printing station may be aligned relative to the first flexographic printing station.

In one or more embodiments of the present invention, a method and system of marking a substrate for visual alignment may provide alignment accuracy of approximately 10 micrometers or less.

In one or more embodiments of the present invention, a method and system of marking a substrate for visual alignment may improve alignment accuracy in a machine direction.

In one or more embodiments of the present invention, a method and system of marking a substrate for visual alignment may improve alignment accuracy in a transverse direction.

In one or more embodiments of the present invention, a method and system of marking a substrate for visual alignment may improves alignment accuracy in any direction.

In one or more embodiments of the present invention, a method and system of marking a substrate for visual alignment may identify misalignments of one or more flexographic printing stations relative to a first flexographic printing station.

In one or more embodiments of the present invention, a method and system of marking a substrate for visual alignment may correct misalignments of one or more flexographic printing stations.

In one or more embodiments of the present invention, a method and system of marking a substrate for visual alignment may correct misalignments by adjusting operational parameters of one or more of the flexographic printing stations while printing is in process.

In one or more embodiments of the present invention, a method and system of marking a substrate for visual alignment is inexpensive to implement.

In one or more embodiments of the present invention, a method and system of marking a substrate for visual alignment is compatible with existing flexographic printing processes.

In one or more embodiments of the present invention, a method and system of marking a substrate for visual alignment does not slow down the flexographic printing process.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. A method of marking a transparent substrate for visual alignment in a multi-station flexographic printing system comprising:
   using a first flexo graphic printing station of the system, printing one or more alignment boxes on the substrate in one or more unique positions for each subsequent flexo graphic printing station of the system; and
   for each subsequent flexographic printing station of the system, printing one or more alignment box completions on the substrate in one or more predetermined positions corresponding to that stations unique positions,
   wherein an alignment between a printed alignment box and a corresponding printed alignment box completion provides a visual indicator of alignment between the first flexographic printing station and a subsequent flexographic printing station that printed the alignment box completion.

2. The method of claim 1, further comprising:
   inspecting the substrate for a visual indicator of alignment between the first flexographic printing station and each subsequent flexographic printing station.

3. The method of claim 1, further comprising:
   determining one or more misalignments between the first flexographic printing station and each subsequent flexographic printing station.

4. The method of claim 1, further comprising:
   correcting one or more misalignments between the first flexographic printing station and each subsequent flexographic printing station.

5. The method of claim 4, wherein correcting one or more misalignments comprises adjusting an operational parameter of a misaligned subsequent flexographic printing station that is misaligned with respect to the first flexographic printing station.

6. The method of claim 1, wherein each alignment box comprises:
   an x-axis crosshair; and
   a y-axis crosshair.

7. The method of claim 6, wherein each alignment box completion comprises:
   an x-axis alignment crosshair; and
   a y-axis alignment crosshair.

8. The method of claim 7, wherein the x-axis alignment crosshair and the y-axis alignment crosshair have a line width of 20 micrometers or less.

9. The method of claim 6, wherein the x-axis crosshair and the y-axis crosshair have a line width of 20 micrometers or less.

10. The method of claim 1, wherein each alignment box comprises a frame.

11. The method of claim 10, wherein each alignment box completion comprises a plurality of completion boxes.

12. The method of claim 1, wherein each alignment box completion comprises a station identifier.

* * * * *